(12) United States Patent
Doi

(10) Patent No.: US 8,759,761 B2
(45) Date of Patent: Jun. 24, 2014

(54) CHARGED CORPUSCULAR PARTICLE BEAM IRRADIATING METHOD, AND CHARGED CORPUSCULAR PARTICLE BEAM APPARATUS

(75) Inventor: Takashi Doi, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 635 days.

(21) Appl. No.: 13/059,654

(22) PCT Filed: Jul. 31, 2009

(86) PCT No.: PCT/JP2009/063978
§ 371 (c)(1),
(2), (4) Date: Feb. 18, 2011

(87) PCT Pub. No.: WO2010/024105
PCT Pub. Date: Mar. 4, 2010

(65) Prior Publication Data
US 2011/0139983 A1 Jun. 16, 2011

(30) Foreign Application Priority Data
Aug. 26, 2008 (JP) ................................ 2008-216098

(51) Int. Cl.
*G01N 23/00* (2006.01)
(52) U.S. Cl.
USPC ............ 250/306; 250/307; 250/310; 250/311
(58) Field of Classification Search
USPC ............ 250/306, 307, 310, 311, 492.1–492.3
See application file for complete search history.

(56) References Cited

U.S. PATENT DOCUMENTS

| 5,371,371 A | * | 12/1994 | Yamazaki et al. ........ 250/396 R |
| 5,644,132 A | | 7/1997 | Litman et al. |
| 5,872,358 A | * | 2/1999 | Todokoro et al. ............. 250/310 |

(Continued)

FOREIGN PATENT DOCUMENTS

| JP | 60-130044 A | 7/1985 |
| JP | 63-274049 A | 11/1988 |

(Continued)

OTHER PUBLICATIONS

Office Action issued Sep. 3, 2013, in Japanese Patent Application No. 2012-186047.

*Primary Examiner* — Michael Maskell
(74) *Attorney, Agent, or Firm* — Miles & Stockbridge P.C.

(57) ABSTRACT

According to a charged corpuscular particle beam irradiating method of this invention, a focusing element (19) which focuses the trajectories of charged corpuscular particles (12) emitted from a specimen (10) is arranged at a position which prevents focusing action by the focusing element (19) from affecting a charged corpuscular particle beam (4) traveling toward the specimen or can curb effects of the focusing action on the charged corpuscular particle beam (4). With this configuration, the focusing action selectively affects the charged corpuscular particles (12) emitted from the specimen (10), and effects of the focusing action on the charged corpuscular particle beam (4) traveling toward the specimen (10) are curbed. Thus, charged corpuscular particles emitted from the specimen (10) and traveling in a direction other than a direction toward a detector and the like can be focused and guided into the detector and the like, and a charged corpuscular particle beam irradiating method capable of efficiently detecting a charged corpuscular particle traveling in a direction other than the direction toward the detector and the like can be provided.

12 Claims, 13 Drawing Sheets

(56) References Cited

U.S. PATENT DOCUMENTS

| | | |
|---|---|---|
| 7,705,302 B2 | 4/2010 | Aoki et al. |
| 2008/0017797 A1* | 1/2008 | Cheng et al. ............... 250/310 |
| 2008/0149831 A1* | 6/2008 | Saito ........................... 250/310 |

FOREIGN PATENT DOCUMENTS

| | | |
|---|---|---|
| JP | 02-109241 A | 4/1990 |
| JP | 08-273569 A | 10/1996 |
| JP | 10-312762 A | 11/1998 |
| JP | 2001-357808 A | 12/2001 |
| JP | 2004-134389 A | 4/2004 |
| JP | 2005-004995 A | 1/2005 |
| JP | 2005-347281 A | 12/2005 |
| JP | 2007-250560 A | 9/2007 |
| JP | 2008-004329 A | 1/2008 |
| JP | 2008-27737 A | 2/2008 |
| JP | 2008-153158 A | 7/2008 |
| JP | 2008-186689 A | 8/2008 |

* cited by examiner

- - - - - - Trajectory of secondary signal before electric charge generation

———— Trajectory of secondary signal after electric charge generation

——— Trajectory of secondary signal when controlled by focusing electrode

CHARGED CORPUSCULAR PARTICLE BEAM IRRADIATING METHOD, AND CHARGED CORPUSCULAR PARTICLE BEAM APPARATUS

TECHNICAL FIELD

The present invention relates to a charged corpuscular particle beam irradiating method and a charged corpuscular particle beam apparatus and, more particularly, to a charged corpuscular particle beam irradiating method and a charged corpuscular particle beam apparatus capable of controlling the trajectory of a secondary signal emitted from a specimen.

BACKGROUND ART

A scanning electron microscope (hereinafter abbreviated as an SEM) that is a type of charged corpuscular particle beam apparatus is an apparatus which accelerates primary electron beams emitted from an electron source, scans a spot beam focused on a specimen by using an electrostatic lens or a magnetic lens over the specimen in a two-dimensional manner, detects a secondary signal such as a secondary electron or a reflection electron generated as a secondary phenomenon from the specimen, and uses the intensity of the detected signal as an intensity-modulated input of a monitor scanned in synchronism with primary electron beam scanning, thereby obtaining a two-dimensional scan image (SEM image).

Along with recent miniaturization in semiconductor industries, SEMs have been used for semiconductor device manufacturing processes or inspection after completion of the processes (e.g., dimensional measurement by using an electron beam or inspection of electrical behavior) instead of optical microscopes. In observation of the multilayer thin film structure of a semiconductor device internal structure, efficient detection of not only a secondary electron having information on a specimen surface but also a reflection electron having inclination information allows surface shape measurement and defect detection evaluation. A modern SEM is provided with, e.g., an energy filter capable of separating secondary electrons and reflection electrons from each other and can form image contrast to suit the intended use. When an ArF resist or a Low-K material used in a recent semiconductor process is subjected to SEM observation, the ArF resist or Low-K material is found to suffer from shrinkage or deformation due to electron beam irradiation. Although this phenomenon can be alleviated by lowering accelerating voltage, the lowering reduces the resolution of an SEM and makes high-resolution observation difficult.

For this reason, a retarding method involving applying a negative voltage to a specimen, a boosting method intended to reduce primary electron beam chromatic aberration by arranging an accelerating electrode near an objective lens, and the like have been adopted to allow high-resolution observation even in a low accelerating voltage region. A detector using an orthogonal electromagnetic field generator for secondary signal separation (EXB) is used to efficiently detect secondary signals such as a secondary electron and a reflection electron emitted from a specimen. A typical example of such a detector is disclosed in Patent Literature 1.

Patent Literature 2 discloses a technique for forming a specimen image in desired contrast by constructing a detector using divided detection elements and performing signal processing according to the trajectory of an electron.

CITATION LIST

Patent Literature

Patent Literature 1: JP Patent Publication (Kokai) No. 2007-250560 A (2007)
Patent Literature 2: JP Patent Publication (Kokai) No. 2005-347281 A (2005)

SUMMARY OF INVENTION

Technical Problem

The trajectory of each electron emitted from a specimen varies depending on the energy of an electron beam reaching the specimen, the status of electric charge deposited on the specimen, and the like. If an electron emitted from the specimen collides with another structure or the like before reaching a detector and a secondary electron conversion electrode (the electrode is an electrode which emits a new secondary electron when collided with an electron emitted from a specimen, and a detector and a secondary electron conversion electrode may be referred to as a detector and the like hereinafter), secondary electron information corresponding to the electron is lost, and the detection efficiency decreases. For example, a method for detecting an electron traveling toward the outside of a detector and the like about an electron beam optical axis is not proposed in Patent Literatures 1 and 2.

A charged corpuscular particle beam irradiating method and a charged corpuscular particle beam apparatus intended to allow efficient detection of a charged corpuscular particle traveling in a direction other than a direction toward a detector and the like will be described below.

Solution to Problem

In order to achieve the above-described object, there is proposed a charged corpuscular particle beam apparatus in which a focusing element which focuses the trajectories of charged corpuscular particles emitted from a specimen is arranged at a position which prevents focusing action by the focusing element from affecting a charged corpuscular particle beam traveling toward the specimen (or can curb effects of the focusing action on the charged corpuscular particle beam) and a charged corpuscular particle beam irradiating method. The focusing action selectively affects electrons emitted from the specimen, and effects of the focusing action on the charged corpuscular particle beam traveling toward the specimen are curbed. Accordingly, charged corpuscular particles emitted from a specimen and traveling in a direction other than a direction toward a detector and the like can be focused and guided into the detector and the like.

Advantageous Effects of Invention

The above-described configuration allows control of charged corpuscular particle detection efficiency without affecting a charged corpuscular particle beam traveling toward a specimen.

DESCRIPTION OF EMBODIMENTS

A charged corpuscular particle beam apparatus capable of controlling the trajectory of a charged corpuscular particle beam emitted from a specimen will be described in detail below with reference to the drawings. Note that although a scanning electron microscope will be described below as an example of a charged corpuscular particle beam apparatus, the present invention is not limited to this. The present invention is also applicable to a focused ion beam apparatus which forms a scan image by scanning a focused ion beam.

In an SEM, the trajectory of an electron emitted from a specimen changes due to, e.g., the energy of an electron beam when the electron beam reaches the specimen and electric charge deposited on the specimen. For example, a secondary signal such as a reflection electron or a secondary electron may collide with another structure before reaching a detector and the like or may pass through a primary electron (electron beam) pass-through hole formed in the detector and the like. This causes the secondary signal to be lost and reduces detection efficiency, which is a problem. An SEM may be unable to cope with a phenomenon in which a secondary signal is subjected to deflection action due to a specimen electrically charged by application of a primary electron beam, the trajectory of the secondary signal changes over time, the secondary signal cannot reach a detector and the like, and detection efficiency decreases.

According to the embodiment to be described below, it is possible to improve the efficiency in detecting a secondary signal emitted from a specimen and perform control to keep a detection signal constant.

In order to attain the above-described object, this embodiment characteristically arranges a focusing electrode between an objective lens and a secondary electron conversion electrode and controls a crossover point of primary electron beams to the center of the focusing electrode, thereby controlling only the trajectory of a secondary signal.

Additionally, this embodiment characteristically arranges a Faraday cup outside the secondary electron conversion electrode, converting a secondary signal not having collided with the secondary electron conversion electrode into a current value to measure the current value, and feeds back the current value to determine a voltage to be applied to the focusing electrode, thereby allowing control of the trajectory of a secondary signal to within the secondary electron conversion electrode.

Figure 1:
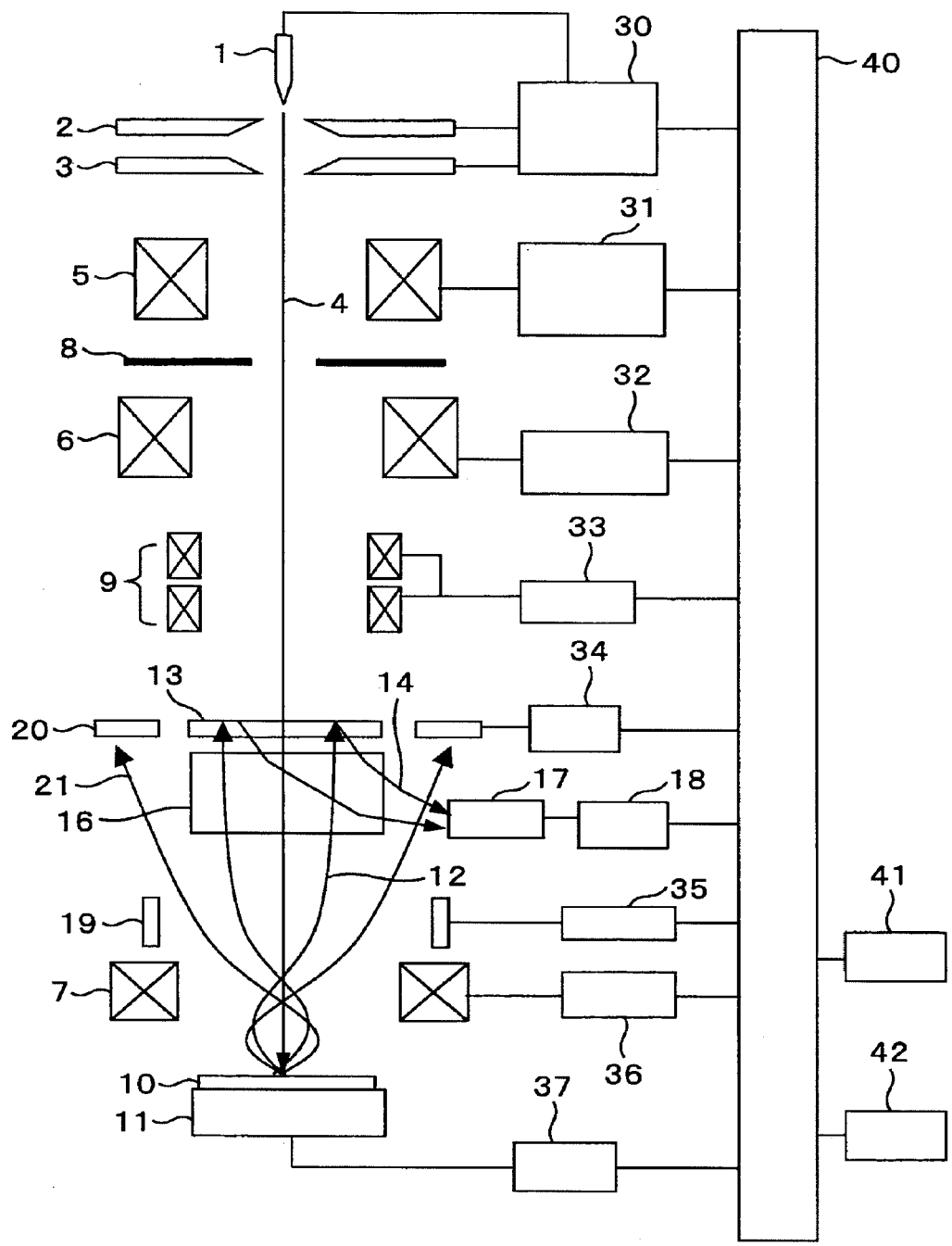
FIG. 1 is a schematic view of the configuration of a scanning electron microscope.

FIG. 1 is a view showing the configuration of a scanning electron microscope. A voltage is applied between a cathode 1 and a first anode 2 by a high-voltage control source 30 which is controlled by a control operation device 40 (control processor), and a predetermined emission current is drawn from the cathode 1. Since an accelerating voltage is applied between the cathode 1 and a second anode 3 by the high-voltage control source 30 controlled by the control operation device 40, a primary electron beam 4 emitted from the cathode 1 is accelerated and advances to a downstream lens system.

The primary electron beam 4 (electron beam) is focused by a focusing lens 5 which is controlled by a focusing lens control source 31. After an unnecessary region of the primary electron beam 4 is removed by a diaphragm plate 8, the primary electron beam 4 is focused as a fine spot on a specimen 10 by a focusing lens 6 which is controlled by a focusing lens control source 32 and an objective lens 7 which is controlled by an objective lens control source 36. The focusing lens 6 can control an object point of the objective lens 7 to an arbitrary position and can control the entrance aperture angle of the objective lens 7.

A negative voltage is applied to the specimen 10 by a specimen application source 37 via a specimen support 11, and an electric field for decelerating a primary electron beam can be generated at the specimen 10 (this method will be referred to as a retarding method). A boosting method involving arranging an electrode which applies a positive voltage for reducing chromatic aberration directly to or to near the objective lens 7 for the purpose of acceleration may also be adopted. As the boosting method, the process of selectively accelerating electron beams in an electron beam path of the objective lens or the process of arranging a tubular accelerating electrode, e.g., from the second anode 3 to the objective lens and applying a positive voltage to the accelerating electrode (hereinafter referred to as column boosting for convenience) may be used.

The primary electron beam 4 is scanned over the specimen 10 in a two-dimensional manner by a scanning coil 9 which is controlled by a scanning coil control source 33. Secondary signals 12, such as a secondary electron and a reflection electron, generated from the specimen 10 by application of the primary electron beam 4 travel to above the objective lens 7 with a finite spread by the action of a pulling magnetic field or pulling electric field generated by the objective lens 7, collide with a secondary electron conversion electrode 13, and generate secondary electrons 14.

The secondary electrons 14 are deflected toward a signal detector 17 by a deflection electric field generated by a deflection electrode 16. A signal detected by the signal detector 17 is amplified by a signal amplifier 18. After that, the signal is transferred to an image memory 41 and is displayed as a specimen image on an image display device 42.

A secondary signal 21 which swerves off from the secondary electron conversion electrode 13 with a finite size is complemented by a Faraday cup 20. An ampere meter 34 can measure the secondary signal 12 which cannot be complemented by the secondary electron conversion electrode as a current. The secondary signals 12 are focused by a focusing electrode 19 which is controlled by a secondary signal control voltage 35, and the spread of the secondary signals at the secondary electron conversion electrode 13 can be controlled.

As a detector for complementing an electron traveling toward the outside of the secondary electron conversion electrode 13, for example, a detector such as a micro channel plate (MCP) detector can also be used instead of the Faraday cup.

Figure 2:
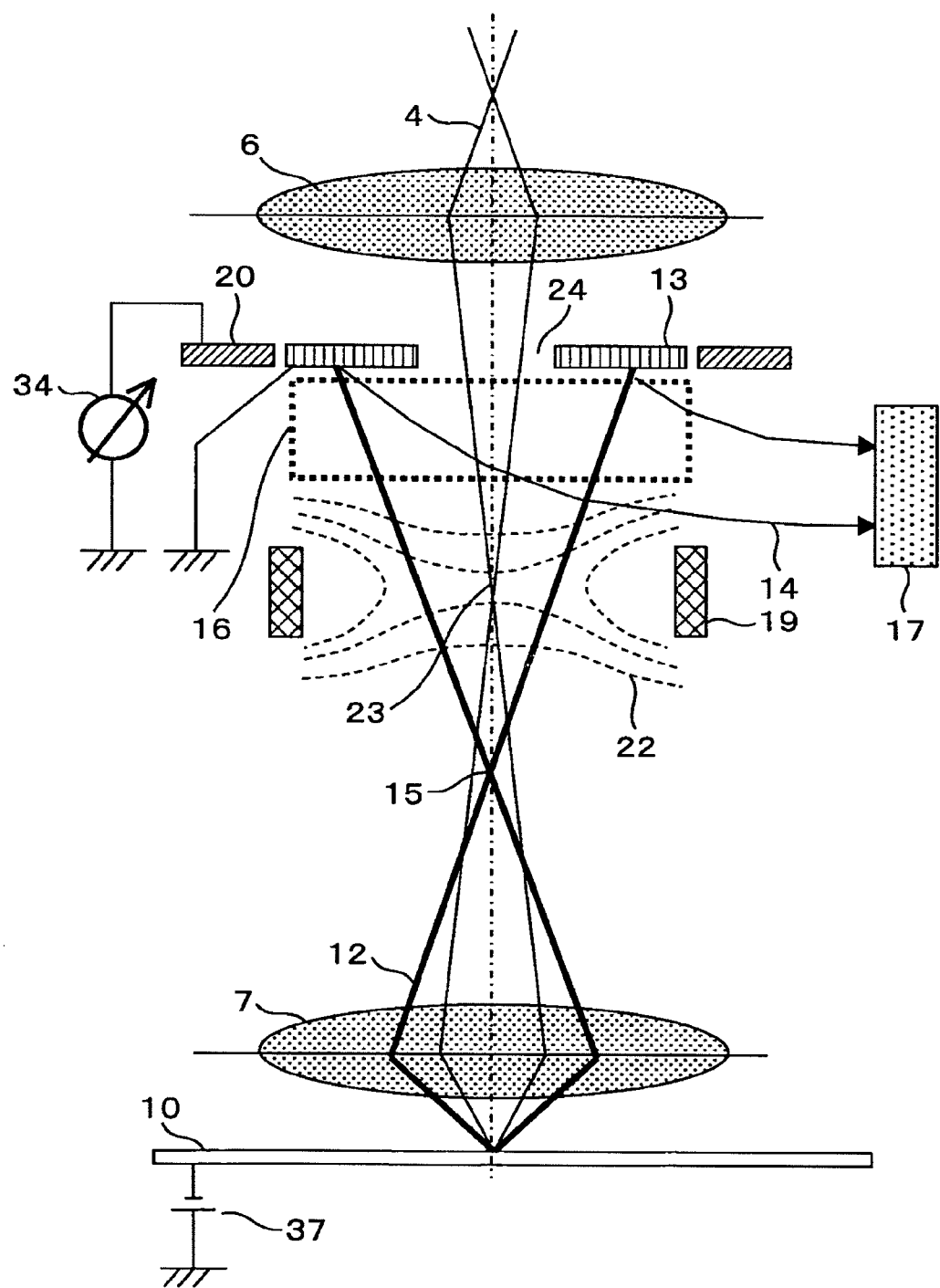
FIG. 2 is a view for explaining the trajectories of electrons emitted from a specimen to when the electrons reach a detector.

An example for controlling the trajectories of the secondary signals 12, such as a secondary electron and a reflection electron, emitted from a specimen will be described below in detail with reference to FIG. 2. FIG. 2 is a view conceptually showing the trajectories of electrons emitted from a specimen to when the electrons reach a detector.

The primary electron beam 4 is focused on an arbitrary crossover point 23 by the focusing lens 6. The crossover point 23 can control the entrance aperture angle of the objective lens 7 and can set conditions for minimizing combined aberration including spherical aberration and chromatic aberration at the objective lens 7, thus resulting in achievement of higher resolution. Optical conditions with a great depth of focus can also be achieved by making the aperture angle small.

The primary electron beam 4 is focused as a fine spot on the specimen 10 by the objective lens 7, and the secondary signals 12 generated from the fine spot travel to above the objective lens 7 by pulling action and focusing action of the objective lens 7. The secondary signals 12 are focused at a crossover point 15 and collide with the secondary electron conversion electrode 13 with a finite spread.

The secondary electrons 14, which are pieces of information from the specimen having undergone conversion by the secondary electron conversion electrode 13, are deflected toward the signal detector 17 by the deflection electrode 16 and are taken in as signals. The deflection electrode 16 may have a simple configuration, i.e., may be composed of two opposing electrodes. An orthogonal electromagnetic field generator for secondary signal separation (EXB) which prevents deflection aberration from occurring in the primary electron beam 4 is desirably used.

The focusing electrode 19 functions as an electrostatic lens by means of a focusing field 22 and controls the trajectories of the secondary signals 12 coming up from the specimen 10. The Faraday cup 20 is arranged outside the secondary electron conversion electrode 13 and complements an electron not having collided with the secondary electron conversion electrode 13. The ampere meter 34 measures the electron as a current value. Feedback control using the current value by the control operation device 40 makes it possible to deflect the secondary signal 12, having deviated from a path from the secondary electron conversion electrode 13, toward the secondary electron conversion electrode 13 and cause the secondary signal 12 to collide with the secondary electron conversion electrode 13. For example, a negative voltage is applied to the focusing electrode 19, and control is performed such that an applied voltage is set to increase with an increase in the amount of electron detected by the Faraday cup 20. With this control, an electron traveling toward the outside of the secondary electron conversion electrode 13 can be guided to the secondary electron conversion electrode 13 without applying an excessive voltage. The Faraday cup 20 is arranged outside the secondary electron conversion electrode 13 about an optical axis of the primary electron beam 4.

The focusing electrode 19 is actually arranged in a path for the primary electron beam 4 (in the same space as a vacuum atmosphere through which the primary electron beam 4 passes). There is thus concern that focusing action also may work on the primary electron beam 4, the crossover point 23 may change, and the focus of the objective lens 7 may be shifted. By arranging the crossover point 23 at the center of the focusing electrode 19 (such that the crossover point 23 is at the same height as the focusing electrode 19 (the center of the focusing electrode 19)), as shown in FIG. 2, only the trajectories of the secondary signals 12 can be focused without changing the crossover point 23 of the primary electron beam 4.

Ideally, the center in a height direction of the focusing field 22 generated by the focusing electrode 19 may be set to be at the same height as the crossover 23. Strictly speaking, since the electric field is large to some degree, the focusing action of the focusing electrode 19 may have some effects on the primary electron beam 4. However, the effects are much smaller than effects on secondary signals.

The secondary signals 12 to be emitted from the specimen 10 are emitted over a wide angular range on the specimen, and have energy within the wide range from several eV to a value corresponding to an accelerating voltage of the primary electron beam 4. The trajectories of the secondary signals 12 thus are not uniform. However, as for secondary electrons with respective pieces of surface information, the number of secondary signals colliding with the secondary electron conversion electrode 13 is a signal of an SEM image. Accordingly, the trajectory of a secondary electron with energy of about 1 to 2 eV which has a high secondary-emission coefficient only needs to be considered.

As for reflection electrons with respective pieces of specimen angle information, an energy filter is arranged between the specimen 10 and the secondary electron conversion electrode 13. The trajectories of the secondary signals 12 can be controlled by separating only reflection electrons from the secondary signals 12 and controlling the spread of the reflection electrons on the secondary electron conversion electrode 13 by using the focusing electrode 19.

A pass-through hole 24 which is larger than the diameter of the primary electron beam needs to be formed at the center of the secondary electron conversion electrode 13 in order to let the primary electron beam 4 pass through the secondary electron conversion electrode 13. For example, if the primary electron beam 4 has a beam diameter of about 0.1 mm at the secondary electron conversion electrode 13, a hole larger than 0.1 is of course necessary. However, if the hole for letting the primary electron beam 4 pass through is too large, the secondary signals 12 coming up from the objective lens 7 also pass through the hole. This leads to a loss of the secondary signals 12 and a reduction in S/N ratio.

The pass-through hole 24 should not be sized to significantly lose the secondary signals 12. Therefore, the secondary signals 12 on the secondary electron conversion electrode 13 need to be spread with respect to the pass-through hole 24 wide enough but not to an extent that causes a reduction in S/N ratio. The pass-through hole is desirably about 0.5 mm to 1.0 mm.

Figure 3:
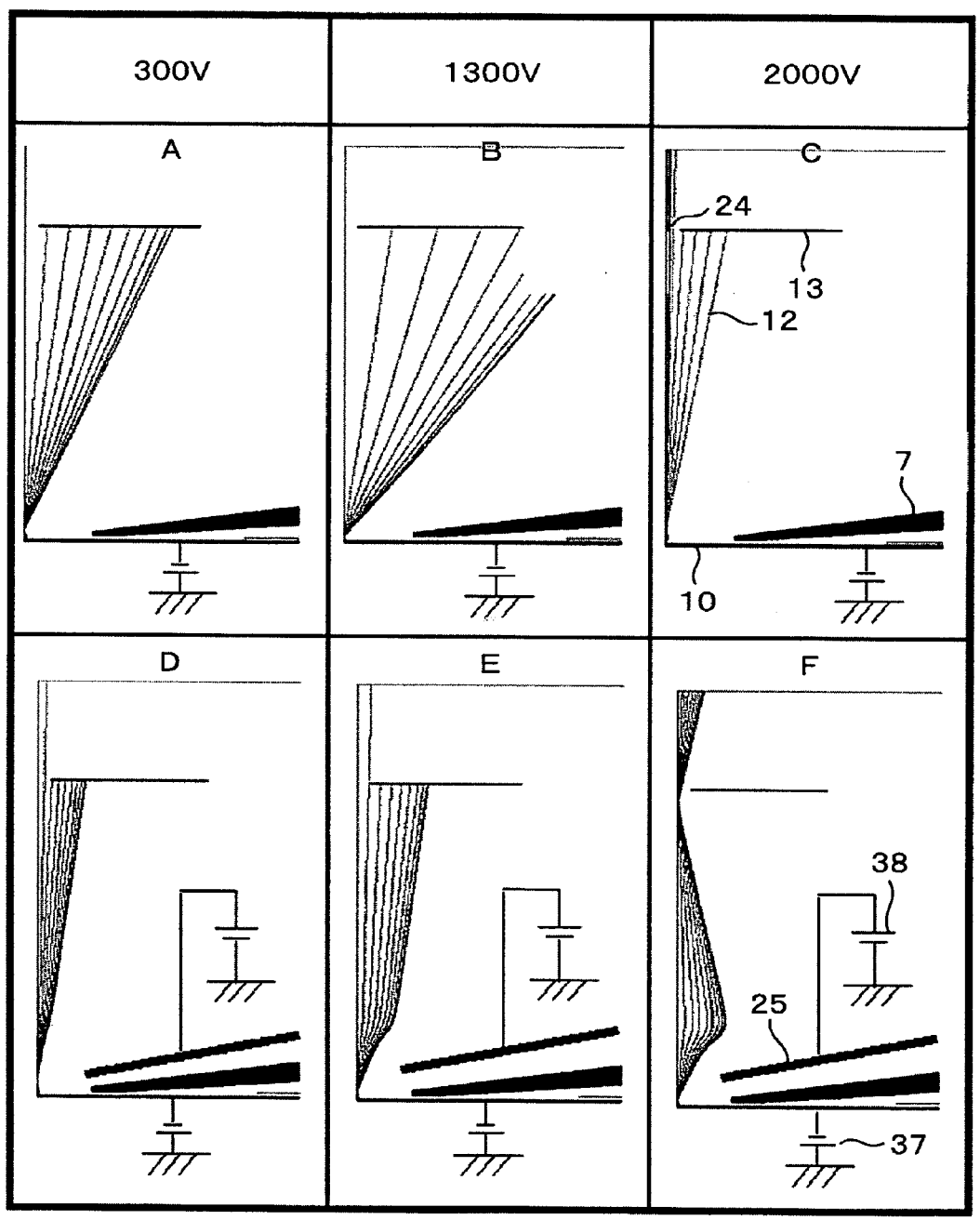
FIG. 3 is a view for explaining an example of results of analyzing a secondary signal trajectory.

FIG. 3 is an example of results of analyzing the trajectory of a secondary signal by simulation in the scanning electron microscope to which this embodiment is applied. The configurations in FIG. 3 are each a configuration of the scanning electron microscope adopting a retarding method. In order to control the landing voltage of the primary electron beam 4 accelerated at −3000 V from the cathode 1 to 300 V, 1300 V, and 2000 V, a voltage of −2700 V in A, a voltage of −1700 V in B, and a voltage of −2000 V in C are applied to the specimen 10. Although the configurations in D, E, and F are equal to those in A, B, and C, respectively, a positive voltage is applied from a boosting source 38 to a boosting electrode 25 which is arranged near the objective lens 7 in the configurations in D, E, and F. Calculation is performed for 2 eV secondary electrons as representatives of secondary electrons among the secondary signals 12. The trajectories of secondary electrons emitted at angles of 0° to 90° from the specimen are shown. Different accelerating voltages cause secondary electrons to have different trajectory patterns on the secondary electron conversion electrode 13, and the amount of signal varies widely among the accelerating voltages. The S/N ratio varies depending on the accelerating voltage. Some of the secondary signals 12 deviate sharply from the secondary electron conversion electrode 13 in the configuration in B, and some of the secondary signals 12 pass through the pass-through hole 24 in the configurations in C and F. In these configurations, signals are not captured, and the S/N ratio degrades significantly.

FIGS. 4 to 8 show examples specifying configurations for correcting the above-described problems. Dotted lines shown as the secondary signals 12 in FIGS. 4 and 6 indicate the trajectories of the secondary signals 12 when the focusing electrode 19 is not used.

Figure 4:
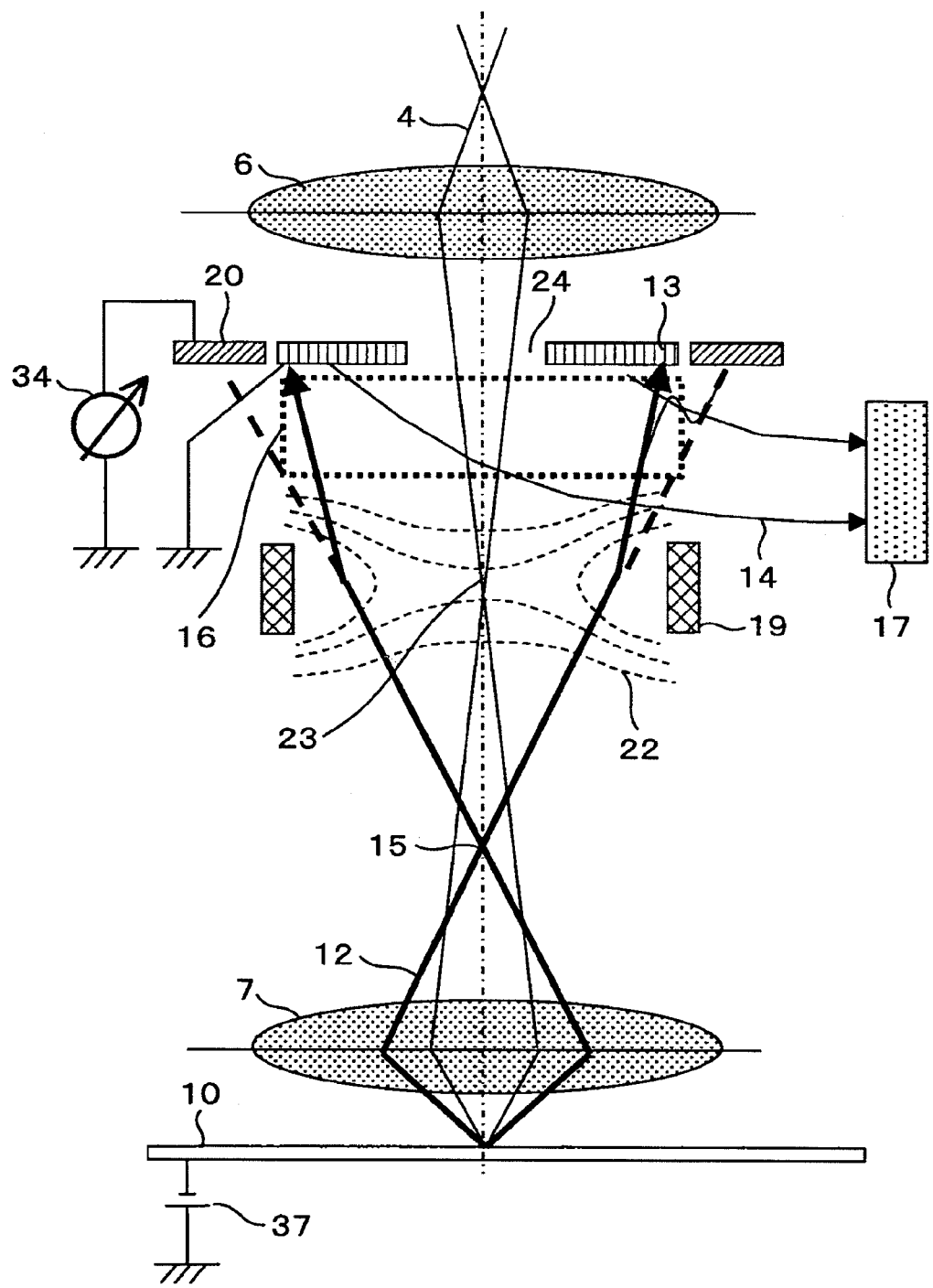
FIG. 4 is a view for explaining an example of secondary signal trajectory control.
Figure 5:
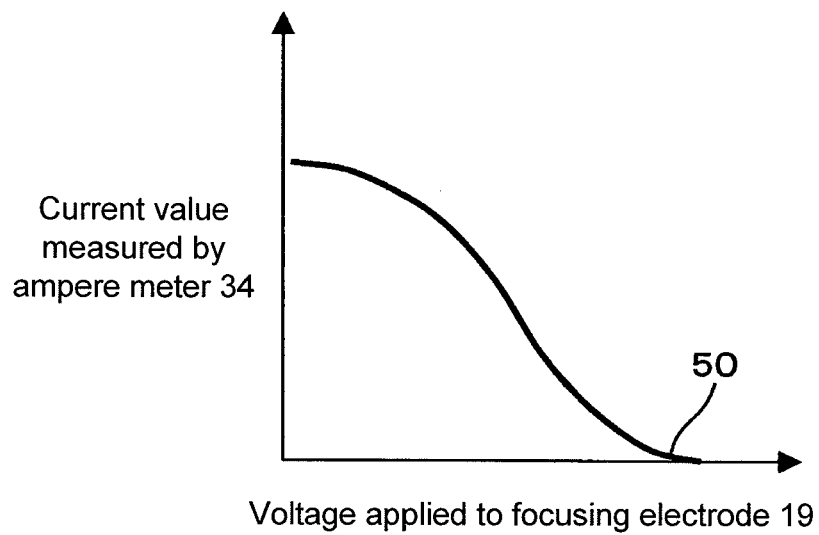
FIG. 5 is a graph showing the relationship between a focusing electrode voltage and a current value detected by a Faraday cup.

FIG. 4 shows an example in which the secondary signals 12 are focused by using the focusing electrode 19 when the secondary signals 12 deviate sharply from the secondary electron conversion electrode 13, as shown in B of FIG. 3. The secondary signals 12 are focused by means of focusing action of the focusing field 22 and, if a voltage applied to the focusing electrode 19 becomes not less than a certain value, collide with the secondary electron conversion electrode 13. FIG. 5 shows the relationship between a voltage value applied to the focusing electrode 19 and a current value measured by the ampere meter 34. The amount of electron of the secondary signals 12 not having collided with the secondary electron conversion electrode 13 is the current value. A reduction in the amount of current measured by the ampere meter 34 caused by the focusing action of the focusing electrode 19 means collision of the secondary signals 12 with the secondary electron conversion electrode 13. Accordingly, if the voltage value of the focusing electrode 19 increases to a voltage 50 in FIG. 5 where the current becomes 0, the S/N ratio can be improved. The spread of the secondary signals 12 colliding with the secondary electron conversion electrode 13 can be kept constant by controlling the voltage value of the focusing electrode 19 to the value of the voltage 50. For example, even if the height of the specimen 10 changes due to the thickness of the specimen, flexure of the specimen, or the like, the amount of secondary electron 14 reaching the detector 17 can be kept constant by controlling the trajectories of the secondary signals 12. This can prevent the S/N ratio from degrading.

As described above, control of the trajectories of electrons emitted from a specimen is intended to maintain a predetermined signal amount and to maximize the amount of signal detected. Examples of a specific method for implementing the control include performing control to minimize the amount of current detected by the ampere meter 34 (ideally, reduce the amount to zero). Another example is control of the amount of current to a predetermined value other than 0. Even control of a detected amount to a value other than 0 can achieve stability of measurement based on maintenance of the detected amount.

This example describes an example in which the value of the voltage applied to the focusing electrode 19 is controlled on the basis of the amount of electron detected by the Faraday cup 20. However, the voltage applied to the focusing electrode 19 may be controlled, e.g., to set the brightness of an image formed on the basis of electrons detected by the detector 17 to a predetermined value. In this case, the voltage applied to the focusing electrode 19 may be controlled also using the ABCC (Auto Brightness Contrast Control) technique to set the brightness to the predetermined value. Note that control involving directly detecting an electron deviating from the secondary electron conversion electrode 13 and reducing such electrons can more directly improve detection efficiency.

Figure 6:
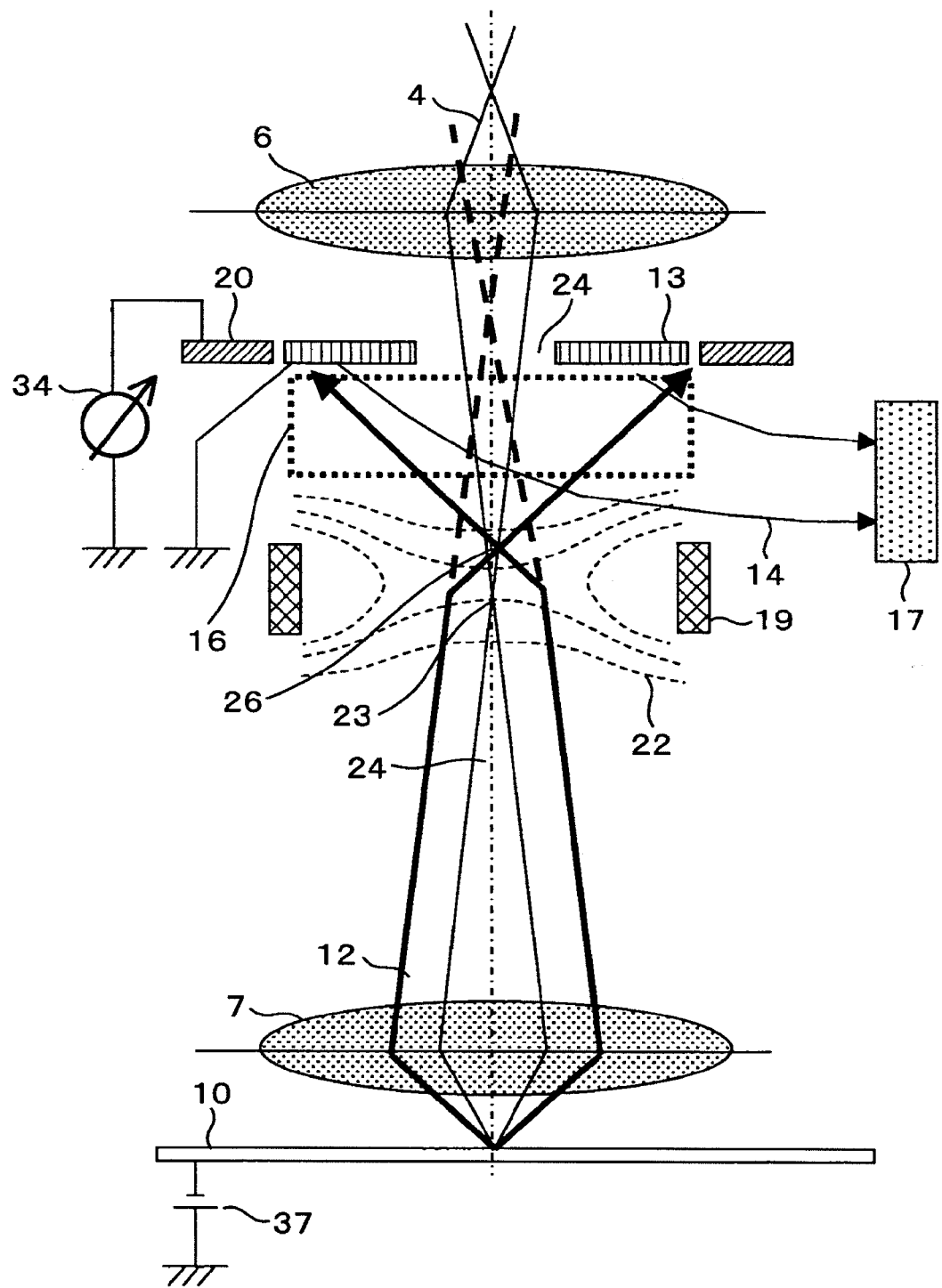
FIG. 6 is a view for explaining an example of secondary signal trajectory control.
Figure 7:
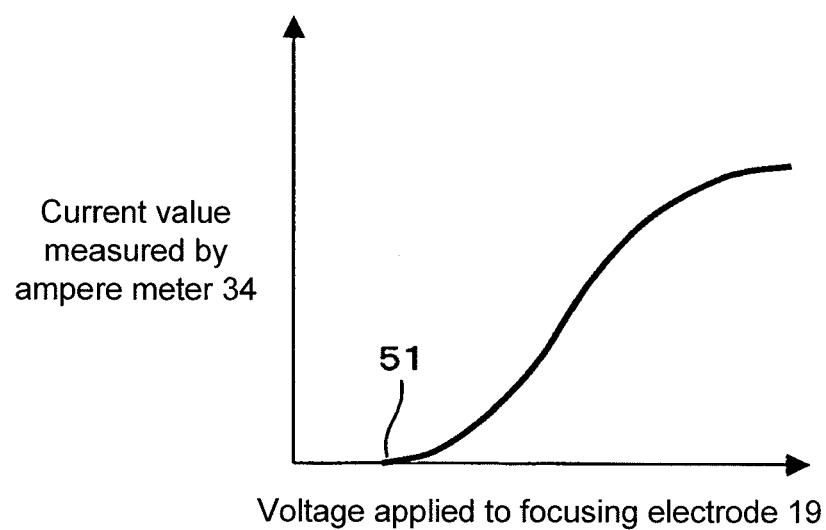
FIG. 7 is a graph showing the relationship between a focusing electrode voltage and a current value.

FIG. 6 shows an example in which the trajectories of the secondary signals 12 are controlled by using the focusing electrode 19 if the secondary signals 12 are lost through the pass-through hole 24 of the secondary electron conversion electrode 13, as shown in F of FIG. 3. The secondary signals 12 form a crossover point 26 between the focusing electrode 19 and the secondary electron conversion electrode 13 by the focusing field 22. The secondary signals 12 having passed through the crossover point 26 collide with the secondary electron conversion electrode 13 while spreading. FIG. 7 shows the relationship between the value of a voltage applied to the focusing electrode 19 and a current value read by the ampere meter 34 in the above configuration. If the voltage is increased to have not less than a certain voltage value, the secondary signal 12 deviates from the secondary electron conversion electrode 13, enters the Faraday cup 20, and is measured as a current value by the ampere meter 34. A rise in the voltage value of the focusing electrode 19 to a voltage 51 at which the current value exceeds 0 means that the secondary signals 12 have spread to be equal in area to the secondary electron conversion electrode 13. Accordingly, keeping the voltage value of the focusing electrode 19 constant, i.e., at the voltage 51 makes it possible to prevent secondary signals from being lost and keep the S/N ratio of an SEM image constant.

Figure 8:
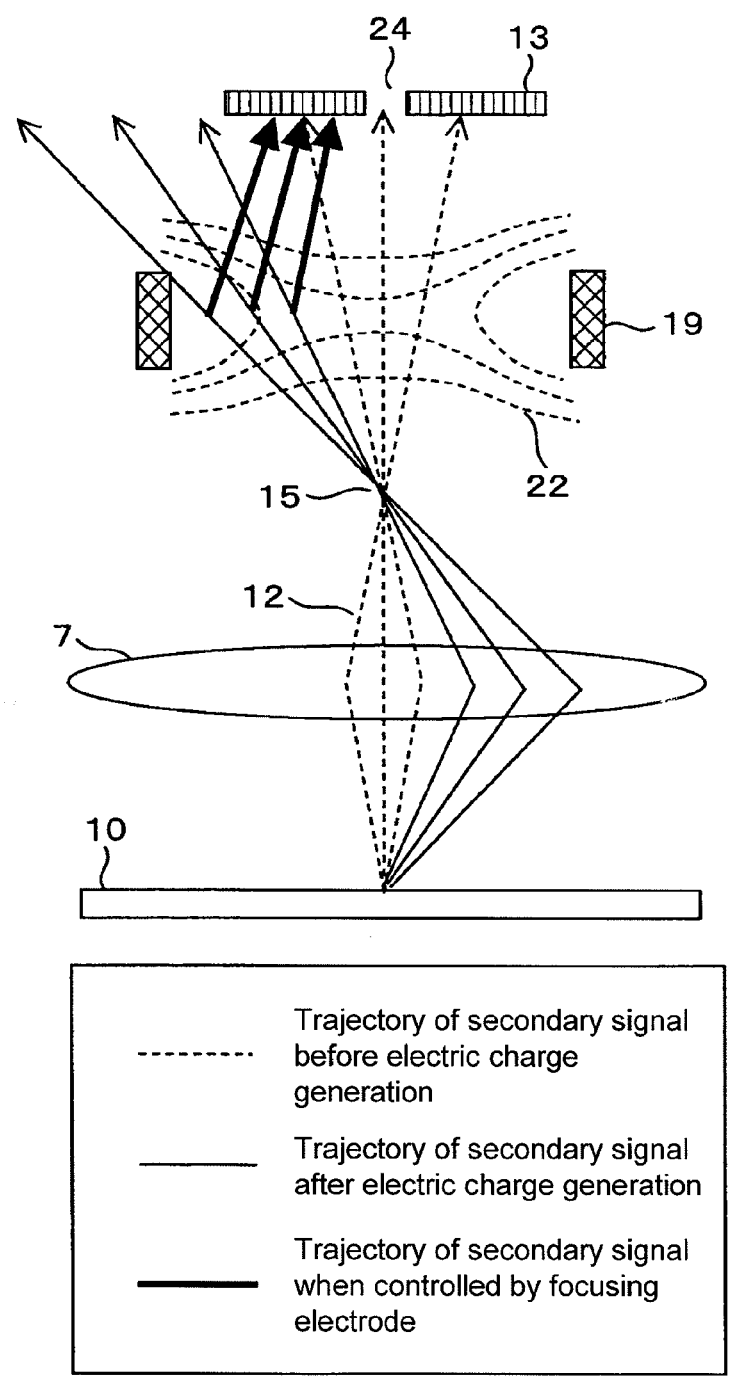
FIG. 8 is a view for explaining an example of secondary signal trajectory control when a specimen is electrically charged.
Figure 9:
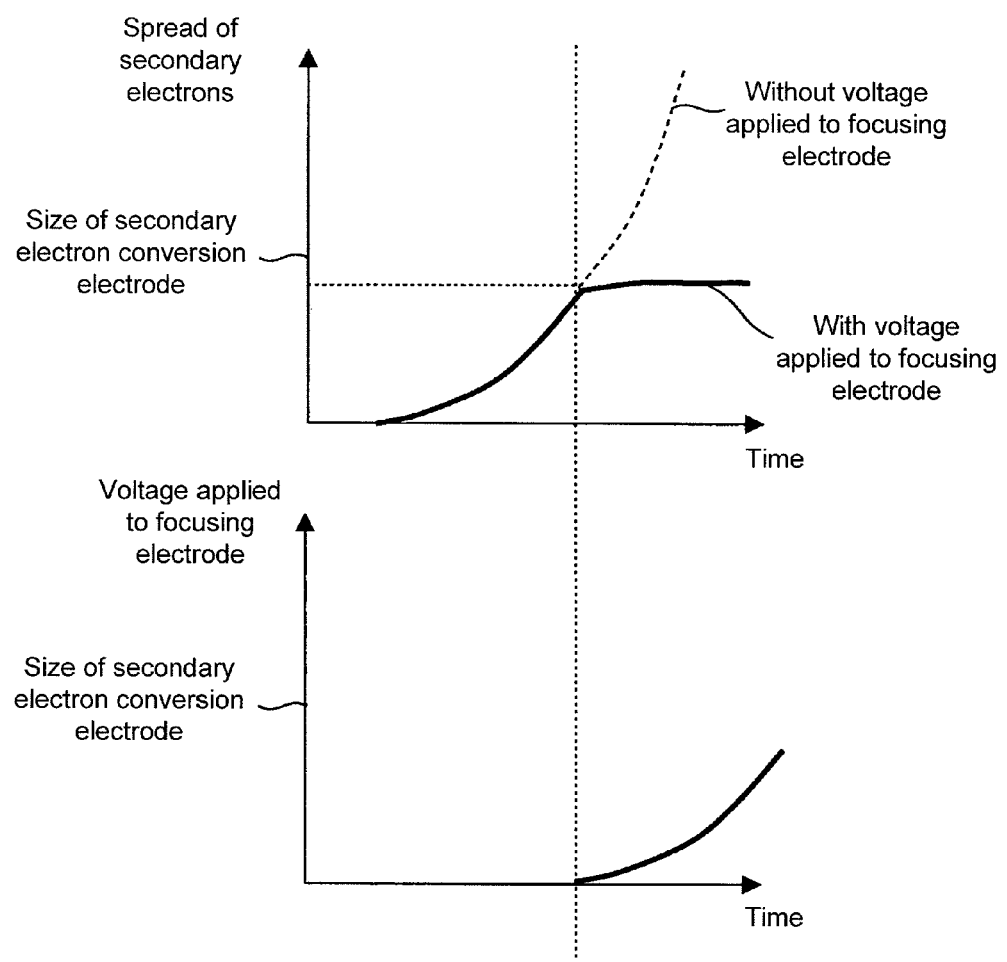
FIG. 9 are graphs for explaining the transition of the relationship between a focusing electrode voltage and a current value when the specimen is electrically charged.

FIG. 8 is a schematic view of another example. The trajectories of ones with low energy of about several eV among the secondary signals 12 generated when the primary electron beam 4 is applied to the specimen 10 are deflected by an electric field generated by negative charge accumulated at the time of application of the primary electron beam 4 and are inclined at angles to a direction perpendicular to the specimen, as indicated by solid lines in FIG. 8. The secondary signals 12 inclined at angles to the direction perpendicular to the specimen pass through the objective lens 7 at positions farther from its center than positions where the secondary signals 12 emitted before electric charge generation pass through the objective lens 7 and enter the secondary electron conversion electrode 13 at positions farther from its center than positions where the secondary signals 12 emitted before electric charge generation. Since the secondary electron conversion electrode 13 has a finite size, the secondary signal 12 inclined from the direction perpendicular to the specimen due to electric charge may not enter the secondary electron conversion electrode 13, and detection efficiency may decrease. If positive charge is excited in an observation region, the secondary signals 12 emitted are made to converge excessively, pass through the pass-through hole 24 formed at the center of the secondary electron conversion electrode 13, and the detection efficiency decreases. The present invention is also effective in keeping the efficiency in detecting secondary electrons when the specimen is electrically charged constant. FIG. 9 are graphs schematically showing a method for controlling the focusing electrode 19 when the specimen is electrically charged. A charging phenomenon progresses constantly during application of the primary electron beam 4, and the spread at the secondary electron conversion electrode 13 changes constantly. Keeping of the spread of the secondary signals 12 at a fixed area to suit the size of the secondary electron conversion electrode 13 can be implemented by measuring a current value at regular time intervals (e.g., every 0.1 ms) by the ampere meter 34, performing feedback control by means of the control operation device 40, and, if the current value increases, controlling the trajectories of the secondary signals 12 in real time by increasing a voltage applied to the focusing electrode 19 such that the current value measured by the ampere meter 34 is 0. In this example, the current value is not necessarily to be made 0. Although some secondary signals deviating from the secondary electron conversion electrode 13 may be lost, the spread of the secondary signals 12 can be kept constant by performing feedback control on the voltage of the focusing electrode 19, for example, such that a current value I measured by the ampere meter 34 is kept at a current value within a certain range (e.g., a value satisfying $1 \text{ pA} \le I < 3 \text{ pA}$). The above-described control is effective not only when negatively charged but also when positively charged.

Figure 10:
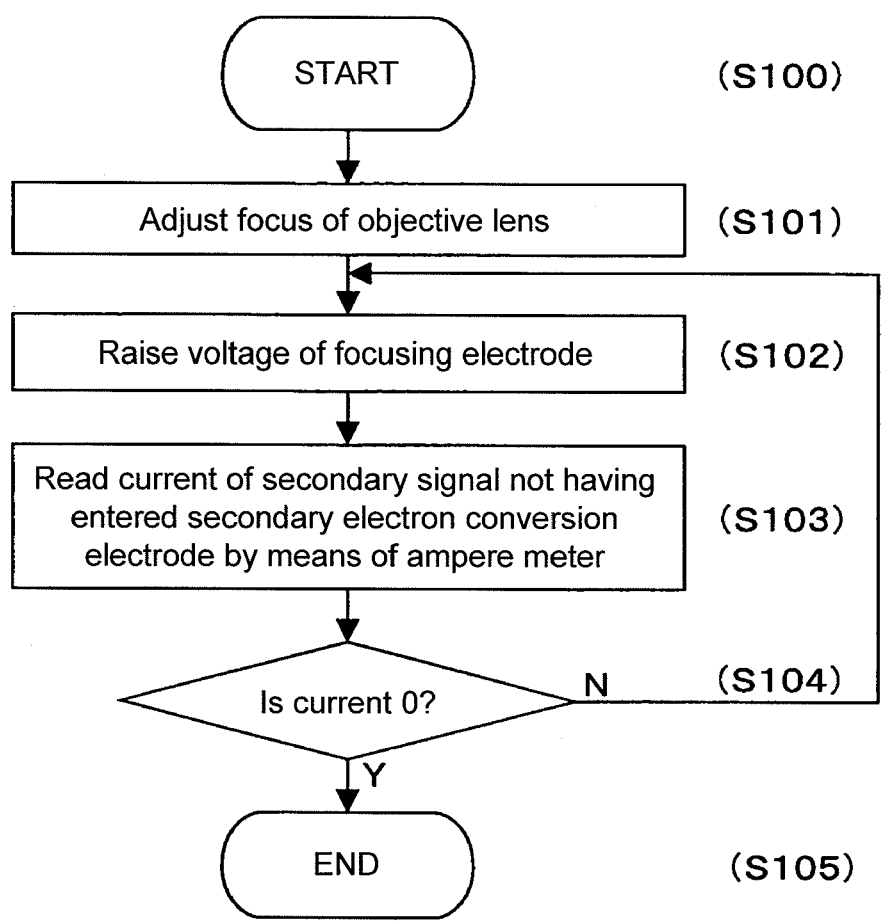
FIG. 10 is a flow chart of secondary signal trajectory control.

FIG. 10 is an example of a flow chart for performing control to keep the above-described secondary signals 12 constant. After the specimen 10 is moved to a predetermined observation position, the focus is adjusted by the objective lens 7 (S101). A voltage to be applied to the focusing electrode 19 is applied, e.g., in steps of 1 V (S102). A current value is measured by the Faraday cup 20 (S103). If the current value is not 0, the voltage to be applied to the focusing electrode 19 is increased by 1 V (S104). When the current becomes 0, the operation ends.

Figure 11:
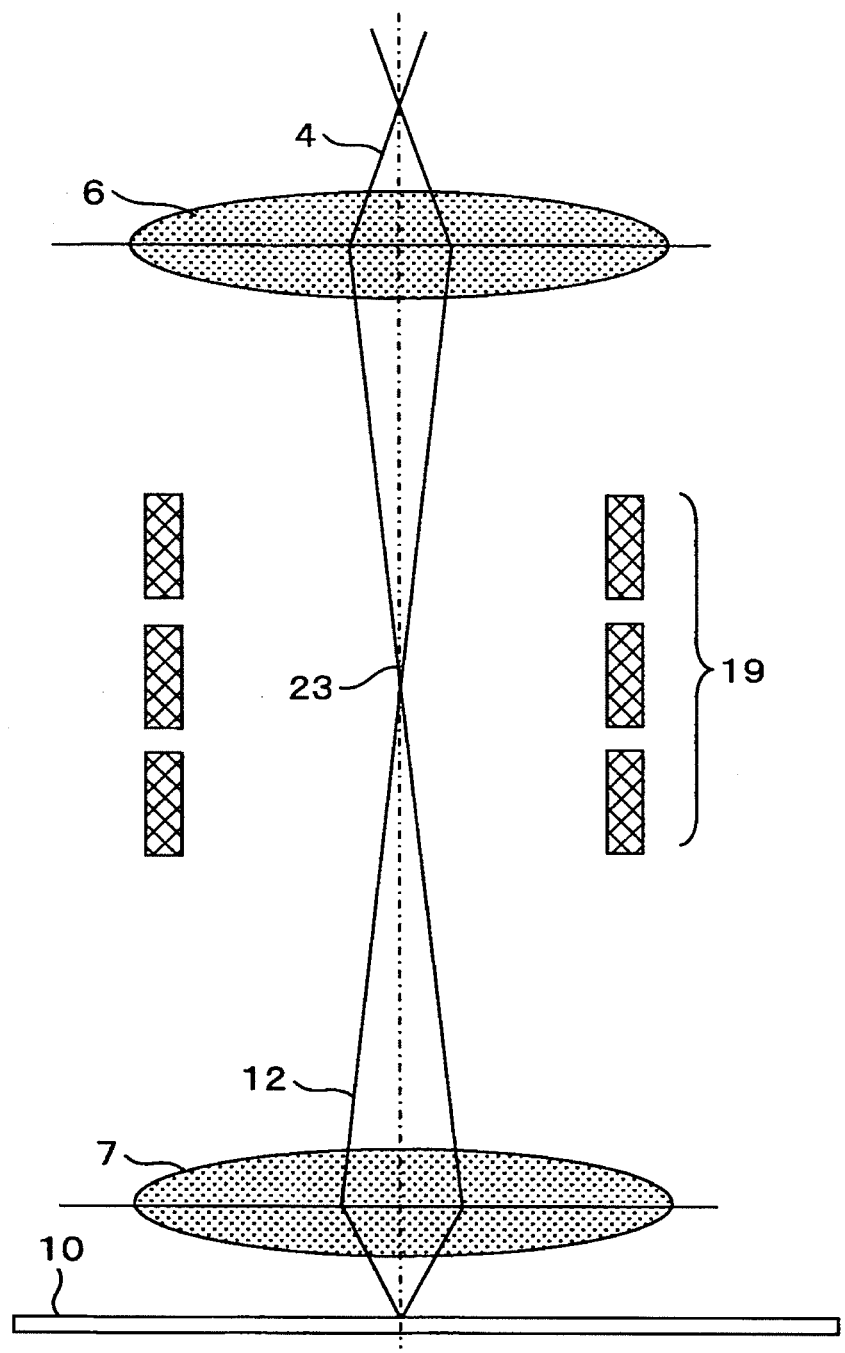
FIG. 11 is a view for explaining an example of the configuration of a multilevel focusing electrode.
Figure 12:
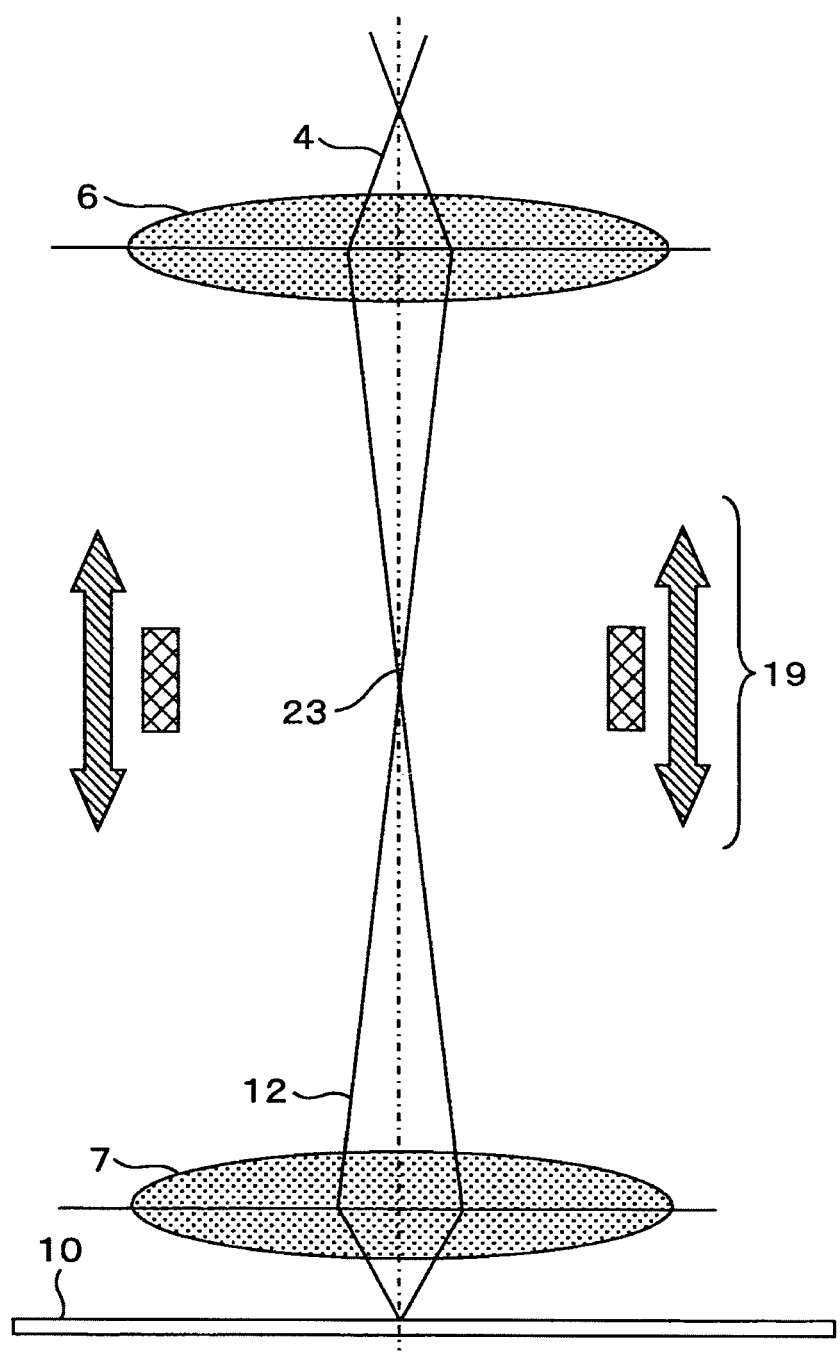
FIG. 12 is a view for explaining an example of the configuration of a focusing electrode having a lift mechanism.

FIG. 11 shows the configuration of the focusing electrode 19. According to the present invention, the focusing electrode 19, which controls the trajectory of the secondary signal 12, is arranged at the crossover point 23 of the primary electron beam 4. The crossover point 23 of the primary electron beam 4 is an important factor which controls the aperture angle at the objective lens 7 and determines the performance of a scanning electron microscope including resolution and a depth of focus. The position of the crossover point 23 varies depending on optical conditions (mode). If a combination of focusing electrodes 19 (multilevel focusing electrode) is used, as shown in FIG. 11, one of the focusing electrodes 19 corresponding to the crossover point 23 can be selected. The focusing electrode 19 may be provided with a lift mechanism, as shown in FIG. 12. The position of the focusing electrode 19 may be variable according to the position of the crossover 23.

The position of the crossover point 23 and that of the focusing electrode 19 may be shifted from each other depending on a change in optical conditions. A prohibition process of disabling application of a voltage to the focusing electrode 19 may be performed or an operator may be notified of an error message to that effect, according to an optical mode and lens conditions. This can prevent a situation in which a voltage is applied to the focusing electrode to aggravate optical conditions when the position (height) of the crossover point and that of the focusing electrode are different.

Note that an SEM which converts an electron emitted from a specimen into a secondary electron by a secondary electron conversion electrode and is provided with a detection mechanism for deflecting a secondary electron toward a detector and detecting the secondary electron has been described so far as an example, the present invention is not limited to this. The present invention is also applicable to, e.g., an SEM in which a detector such as an MCP detector is arranged on the trajectory of an electron emitted from a specimen and which includes a detection mechanism for directly detecting an electron emitted from the specimen.

A focusing coil which generates a focusing magnetic field can also be used instead of the focusing electrode 19, which focuses electrons emitted from a specimen.

Figure 13:
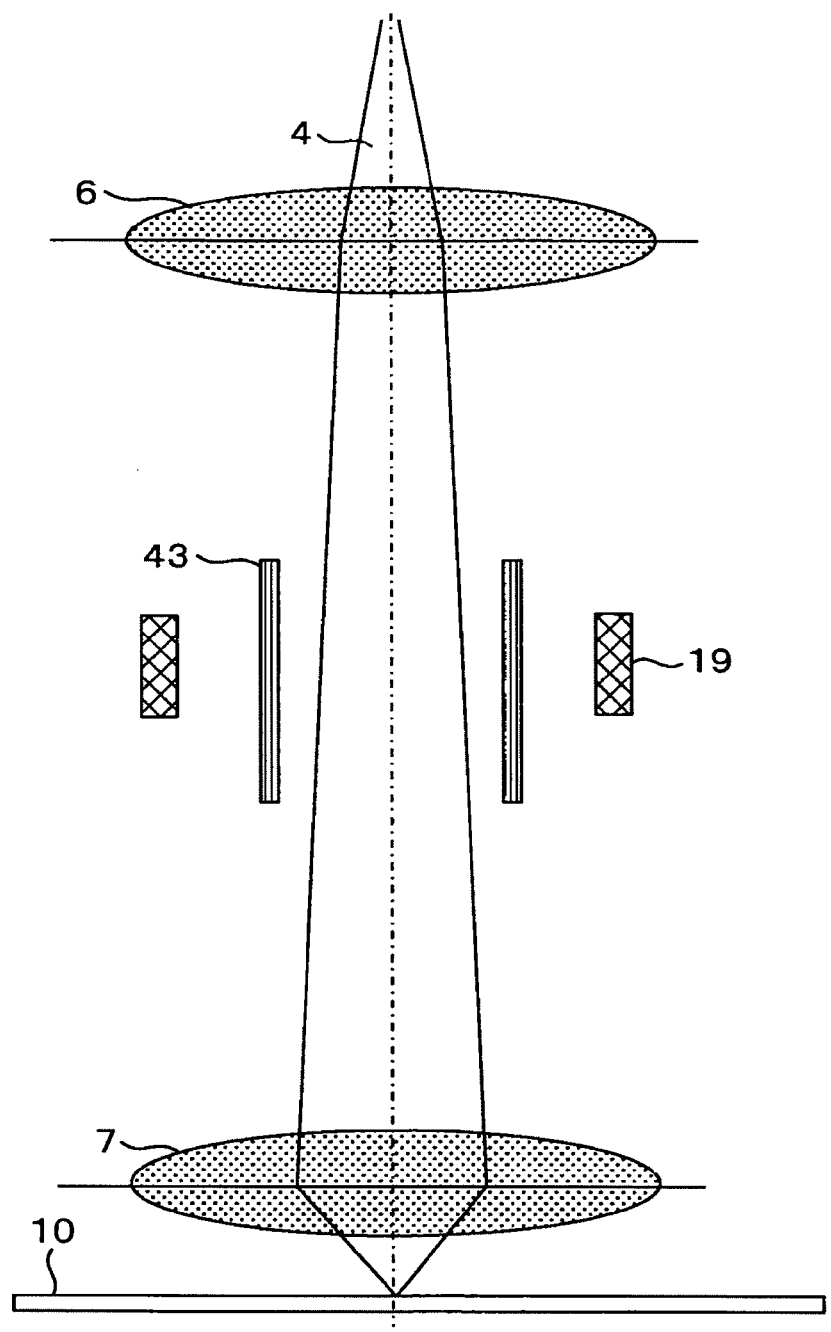
FIG. 13 is a view for explaining the outline of an optical system which does not form a crossover.

Another method for selectively focusing electrons emitted from a specimen under conditions that do not affect an electron beam will be described with reference to FIG. 13. FIG. 13 is a view for explaining an example of an optical system which does not form a crossover by means of the focusing lens 6 (which does not perform focusing in this optical system). A shield electrode 43 is arranged between the focusing electrode 19 and the primary electron beam 4 (electron beam optical axis). The shield electrode 43 is a tubular body which surrounds the electron beam optical axis and inhibits a focusing electric field generated by the focusing electrode 19 from reaching the primary electron beam 4. Since the focusing electric field formed by the focusing electrode 19 does not reach the electron beam optical axis, the trajectory of an electron traveling outside the shield electrode 43 can be selectively controlled. With this configuration, a focusing electrode can be used outside a range within which a crossover is formed both in an optical system which does not form a crossover and in an optical system which forms a crossover. Note that although the shield electrode 43 can inhibit the focusing electric field formed by the focusing electrode 19 from reaching the primary electron beam 4, focusing action cannot be brought about to a second electron or the like passing through the shield electrode 43, and the shield electrode 43 can be a stumbling block to an electron traveling toward a detector. Accordingly, the focusing electrode 19 is desirably used in an optical system which forms a crossover.

Note that if a focusing coil is used instead of the focusing electrode 43, a magnetic shield may be used instead of the shield electrode 43.

The above description is based on the assumption that a retarding method is used. In the case of the column boosting method described above, an electron emitted from a specimen is accelerated toward an electron source by a tubular electrode with an applied positive voltage. Accordingly, an electron with energy of close to 0 eV can be guided to a secondary electron conversion electrode (or a detector) without adopting a retarding method. Of course, the present invention can be applied to an optical system using both a retarding method and a boosting method (or a column boosting method).

REFERENCE SIGNS LIST

1 cathode
2 first anode
3 second anode
4 primary electron beam
5, 6 focusing lens
7 objective lens
8 diaphragm plate
9 scanning coil
10 specimen
11 specimen support
12, 21 secondary signal
13 secondary electron conversion electrode
14 secondary electron
15, 23, 26 crossover point
16 deflection electrode
17 signal detector
18 signal amplifier
19 focusing electrode
20 Faraday cup
22 focusing field
24 pass-through hole
25 boosting electrode
30 high-voltage control source
31, 32 focusing lens control source
33 scanning coil control source
34 ampere meter
35 secondary signal control voltage
36 objective lens control source 37 specimen application source
38 boosting source
40 control operation device
41 image memory
42 image display device

The invention claimed is:

1. A charged particle beam irradiating method for applying a charged particle beam to a specimen and detecting a charged particle emitted from the specimen at a position where the charged particle beam is applied to the specimen,
 wherein a charged particle beam apparatus comprises a focusing element which focuses a charged particle emitted from a specimen, a detector which detects the charged particle emitted from the specimen or an electron generated when the emitted charged particle collides with a secondary electron conversion member, an outer detector, outside the detector or the secondary electron conversion member, about the charged particle beam,
 wherein the outer detector is placed at a position where the charged particle emitted from the specimen collides therewith, and
 wherein the focusing element is adjusted to reduce the amount of the charged particle detected by the outer detector.

2. The charged particle beam irradiating method according to claim 1,
 wherein the position that exerts the focusing action stronger than the focusing action which is exerted on the charged particle beam applied to the specimen on the charged particle emitted from the specimen is located in a path for the charged particle beam and at a same height as a crossover point of the charged particle beam.

3. The charged particle beam irradiating method according to claim 1,
 wherein a tubular body which surrounds the charged particle beam applied to the specimen and inhibits the focusing action of the focusing element on the charged particle beam is arranged between the position at which the focusing element is arranged and the charged particle beam applied to the specimen.

4. A charged particle beam apparatus, comprising:
 a charged particle source;
 a charged optical system which focuses a charged particle beam emitted from the charged particle source and scans the charged particle beam over a specimen; and
 a detector which detects a charged particle emitted from the specimen or an electron generated when the emitted charged particle collides with a secondary electron conversion member,
 an outer detector, outside the detector or the secondary electron conversion member, about the charged particle beam, the outer detector detecting the charged particle emitted from the specimen; and
 a focusing element which focuses the charged particle emitted from the specimen,
 wherein the focusing element is arranged at a position that exerts a focusing action stronger than a focusing action which is exerted on the charged particle beam applied to the specimen on the charged particle emitted from the specimen.

5. The charged particle beam apparatus according to claim 4,
 wherein the focusing element is arranged at a same height as a crossover of the charged particle beam emitted from the charged particle source.

6. The charged particle beam apparatus according to claim 5, further comprising:
 a movement mechanism for moving the focusing element to follow movement of the crossover.

7. The charged particle beam apparatus according to claim 5, further comprising:
 a control device which controls the focusing element,
 wherein a plurality of the focusing elements are arranged along an optical axis of the charged particle beam, and the control device controls the focusing elements such that focusing is performed by one of the focusing elements which is at a same height as the crossover after movement.

8. The charged particle beam apparatus according to claim 4,
 wherein a tubular body which surrounds the charged particle beam applied to the specimen and inhibits the focusing action of the focusing element on the charged particle beam is arranged between the position at which the focusing element is arranged and the charged particle beam applied to the specimen.

9. The charged particle beam apparatus according to claim 4,
 wherein the outer detector is a Faraday cup.

10. The charged particle beam apparatus according to claim 4, further comprising:
 a control device which controls the focusing element,
 wherein the control devices controls the focusing element to reduce the amount of charged particle detected by the outer detector.

11. A charged particle beam apparatus, comprising:
 a charged particle source;
 a charged optical system which focuses a charged particle beam emitted from the charged particle source and scans the charged particle beam over a specimen;
 a detector which detects a charged particle emitted from the specimen or an electron generated when the emitted charged particle collides with a secondary electron conversion member;
 a focusing element which focuses the charged particle emitted from the specimen;
 an outer detector outside the detector or the secondary electron conversion member about the charged particle beam, the outer detector being placed at a position where the charged particle emitted from the specimen collides therewith; and
 a control device which controls the focusing element to reduce the amount of the charged particle detected by the outer detector.

12. The charged particle beam apparatus according to claim 11,
 wherein the focusing element is adjusted to reduce the amount of a part of the charged particle emitted from the specimen which is traveling toward the detector or an outside of the secondary electron conversion member.

* * * * *